United States Patent [19]
Ohki

[11] Patent Number: 5,923,578
[45] Date of Patent: *Jul. 13, 1999

[54] DATA PROCESSING CIRCUIT

[75] Inventor: Mitsuharu Ohki, Tokyo, Japan

[73] Assignee: Sony Corporation, Japan

[*] Notice: This patent is subject to a terminal disclaimer.

[21] Appl. No.: 08/780,893

[22] Filed: Jan. 9, 1997

Related U.S. Application Data

[60] Continuation of application No. 08/297,921, Aug. 31, 1994, Pat. No. 5,627,776, which is a division of application No. 07/826,523, Jan. 27, 1992, Pat. No. 5,367,700.

[30] Foreign Application Priority Data

Jan. 31, 1991 [JP] Japan ..................................... 3-031760

[51] Int. Cl.$^6$ ............................... G06F 7/44; G06F 15/00
[52] U.S. Cl. ....................................................... 364/760.01
[58] Field of Search ....................... 395/800; 364/724.01, 364/736, 754, 715.08, 760.01, 724.13

[56] References Cited

U.S. PATENT DOCUMENTS

| | | | |
|---|---|---|---|
| 3,781,819 | 12/1973 | Geng et al. ............................... | 395/550 |
| 4,322,810 | 3/1982 | Nakayama ............................ | 364/750.5 |
| 4,472,788 | 9/1984 | Yamazaki ................................. | 364/754 |
| 4,611,305 | 9/1986 | Iwase ....................................... | 364/736 |
| 4,866,654 | 9/1989 | Yamada ..................................... | 364/754 |
| 5,021,987 | 6/1991 | Chan et al. ............................... | 364/754 |
| 5,130,940 | 7/1992 | Omoto ................................. | 364/715.08 |
| 5,185,714 | 2/1993 | Nakayama ............................ | 364/750.5 |
| 5,195,050 | 3/1993 | Hsu et al. ........................... | 364/728.01 |
| 5,204,829 | 4/1993 | Lyu et al. ................................. | 364/748 |

*Primary Examiner*—Kevin J. Teska
*Assistant Examiner*—Ayni Mohamed
*Attorney, Agent, or Firm*—Rader, Fishman & Grauer; Ronald P. Kananen

[57] ABSTRACT

A data processing circuit multiplies, by $2^a$, input data supplied in a time-division multiplexed manner over a plurality of lines. The data processing circuit includes first, second, and third data selectors each having first, second, and third input terminals and a single output terminal. The first input terminal of the first selector is supplied with an input signal of "0". A first input line is connected in common to the second input terminal of the first data selector and the first input terminal of the second data selector. A second input line is connected in common to the third input terminal of the first data selector and the second input terminal of the second data selector. A third input line is connected in common to the third input terminal of the second data selector and the second input terminal of the third data selector. The first, second, and third input lines are supplied input data in a time-division multiplexed manner Each of the first, second, and third data selectors selects one of the input data supplied to the first, second, and third input terminals and outputs the selected data through the output terminal.

49 Claims, 12 Drawing Sheets

FIG. 2A

FIG. 2B (Low-Order 3 Bits) (High-Order 3 Bits)

FIG. 2C (Low-Order 3 Bits) (Middle-Order 3 Bits) (High-Order 3 Bits)

DATA PROCESSING CIRCUIT

This application is a continuation of application Ser. No. 08/297,921 filed on Aug. 31, 1994, now U.S. Pat. No. 5,627,776 which is a divisional application of Ser. No. 07/826,523 filed on Jan. 27, 1992, now U.S. Pat. No. 5,367,700, issued on Nov. 22, 1994.

BACKGROUND OF THE INVENTION

1. Field of the Invention

The present invention relates to a data processing circuit for multiplying, by $2^a$, input data supplied in a time-division multiplexed manner over a plurality of lines, for example.

2. Description of the Prior Art

Digital data processing circuits make a wide use of multipliers. To reduce the size of a digital data processing circuit, it is therefore required to reduce the size of the multipliers used because they are larger in circuit scale than adders.

FIG. 1 of the accompanying drawings shows a conventional multiplier. The multiplier shown in FIG. 1 comprises a plurality of connected adder circuits 1A, 1B, . . . each composed of a plurality of full adders.

The conventional multiplier is however large in overall circuit scale as it is simply made of plural connected adder circuits each comprising a plurality of full adders.

According to one proposal, a multiplier may comprise a combination of a processing circuit for multiplying each item of input data by $2^a$ (a = . . . , −2, −1, 0, 1, 2, . . . ) and adder circuits. The input data may be transmitted in a time-division multiplexed manner over a plurality of lines to the multiplier.

Some systems for transmitting input data in a time-division multiplexed fashion will be described below with reference to FIGS. 2A, 2B, and 2C.

In the system shown in FIG. 2A, data rows A, B, C, . . . each having a word length of 3 bits are successively transmitted over a single signal line. More specifically, if it is assumed that the 3-bit data rows A, B, C, . . . are indicated by A=(A2, A1, A0), B=(B2, B1, B0), C=(C2, C1, C0), . . . , respectively, then the data are successively transmitted in the sequence of A0, A1, A2, B0, B1, B2, C0, . . . one bit in a cycle over the signal line.

In the system shown in FIG. 2B, data rows A, B, C, . . . each having a word length of 6 bits are transmitted as data of high-order 3 bits and low-order 3 bits over two signal lines. More specifically, if it is assumed that the 6-bit data rows A, B, C, . . . are indicated by A=(A5, A4, A3, A2, A1, A0), B=(B5, B4, B3, B2, B1, B0), C=(C5, C4, C3, C2, C1, C0), . . . , respectively, then the data are successively transmitted in the sequence of A0, A1, A2, B0, B1, B2, C0, . . . one bit in a cycle over the first signal line, and in the sequence of A3, A4, A5, B3, B4, B5, C3, . . . one bit in a cycle over the second signal line with a delay of 3 cycles with respect to the first signal line.

In the system shown in FIG. 2C, data rows A, B, C, . . . each having a word length of 9 bits are transmitted as data of high-order 3 bits, middle-order 3 bits, and low-order 3 bits over three signal lines. More specifically, if it is assumed that the 9-bit data A are indicated by A=(A8, . . . , A1, A0), then the low-order bits (A0, A1, A2) are transmitted over the first signal line, the middle-order bits (A3, A4, A5) are transmitted over the second signal line with a delay of 3 cycles, and the high-order bits (A6, A7, A8) are transmitted over the third signal line with a further delay of 3 cycles. If it is assumed that the 9-bit data B are indicated by B=(B8, . . . , B1, B0), then the bits (Bj, Bj+1, Bj+2) of the data B are transmitted, following the bits (Aj, Aj+1, Aj+2) of the data A, over the signal lines. The bits of the data C are thereafter transmitted following the data B.

According to a generalization of the data transmission systems shown in FIGS. 2A, 2B, and 2C, data rows A, B, C, . . . each having a word length of n (n is a multiple of 3) can be transmitted in a time-division multiplexed fashion over n/3 signal lines. The data structure of the data rows is expressed by the following equations (1):

$$A = (An\text{-}1, An\text{-}2, \ldots, A1, A0),$$
$$B = (Bn\text{-}1, Bn\text{-}2, \ldots, B1, B0),$$
$$C = (Cn\text{-}1, Cn\text{-}2, \ldots, C1, C0) \quad (1)$$

where An-1, Bn-1, Cn-1 are MSBs and A0, B0, C0 are LSBs.

The data rows according to the equations (1) can also be transmitted in a time-division multiplexed manner over 2×n/6 signal lines, as shown in FIGS. 3A, 3B, and 3C. FIG. 3A shows a data transmission system in which data rows A, B, C, . . . each having a word length of 6 bits are transmitted over two signal lines. FIG. 3B shows a data transmission system in which data rows A, B, C, . . . each having a word length of 12 bits are transmitted over four signal lines. FIG. 3C shows a data transmission system in which data rows A, B, C, . . . each having a word length of 18 bits are transmitted over six signal lines. Furthermore, data rows A, B, C, . . . each having a word length of n (n is a multiple of 4) can be transmitted in a time-division multiplexed fashion over n/4 signal lines.

OBJECTS AND SUMMARY OF THE INVENTION

It is an object of the present invention to provide a data processing circuit for multiplying input data by $2^a$ in a system which is supplied with the input data in a time-division multiplexed fashion over a plurality of signal lines.

According to the present invention, there is provided a data processing circuit comprising a first selector having a first input terminal, a second input terminal, a third input terminal, and a single output terminal, the first input terminal being receptive of a low-level signal, a second data selector having a first input terminal, a second input terminal, a third input terminal, and a single output terminal, a third data selector having a first input terminal, a second input terminal, a third input terminal, and a single output terminal, the third input terminal being receptive of a low-level signal, a first input line connected in common to the second input terminal of the first data selector and the first input terminal of the second selector, a second input line connected in common to the third input terminal of the first data selector and the second input terminal of the second data selector, and a third input line connected in common to the third input terminal of the second data selector and the second input terminal of the third selector, wherein the first, second, and third input lines are supplied input data in a time-division multiplexed manner, and each of the first, second, and third data selectors selects one of the input data supplied to the first, second, and third input terminals and outputs the selected data through the output terminal.

According to the present invention, there is also provided a data processing circuit comprising a first data selector having a first input terminal, a second input terminal, a third input terminal, and a single output terminal, the first input terminal being receptive of a low-level signal, a second data selector having a first input terminal, a second input terminal, a third input terminal, and a single output terminal, a third data selector having a first input terminal, a second input terminal, a third input terminal, and a single output terminal, a first input line connected in common to the second input terminal of the first data selector and the first input terminal of the second selector, a second input line connected in common to the third input terminal of the first data select or and the second input terminal of the second data selector, a third input line connected in common to the third input terminal of the second data selector and the second input terminal of the third selector, and a register connected between the output terminal and the third input terminal of the third data selector, wherein the first, second, and third input lines are supplied input data in a time-division multiplexed manner, and each of the first, second, and third data selectors selects one of the input data supplied to the first, second, and third input terminals and outputs the selected data through the output terminal.

When the input data supplied to the first input terminals of the first, second, and third data selectors are selected and outputted, for example, the input data are multiplied by 2. When the input data supplied to the third input terminals of the first, second, and third data selectors are selected and outputted, for example, the input data are multiplied by ½. The data processing circuit which operates in this manner is capable of multiplying, by $2^a$ (a is an integer), the input data that are supplied in a time-division multiplexed manner.

Data processing circuits of the above structure and adder circuits may be combined into a multiplier of a relatively small circuit scale.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 2A, 2B, and 2C are timing charts showing data transmission systems for transmitting data in a time-division multiplexed manner;

FIGS. 3A, 3B, and 3C are timing charts showing other data transmission systems for transmitting data in a time-division multiplexed manner;

DETAILED DESCRIPTION OF THE PREFERRED EMBODIMENTS

A data processing circuit according to an embodiment of the present invention will be described below with reference to FIGS. 4 through 8A–8I.

Figure 1:
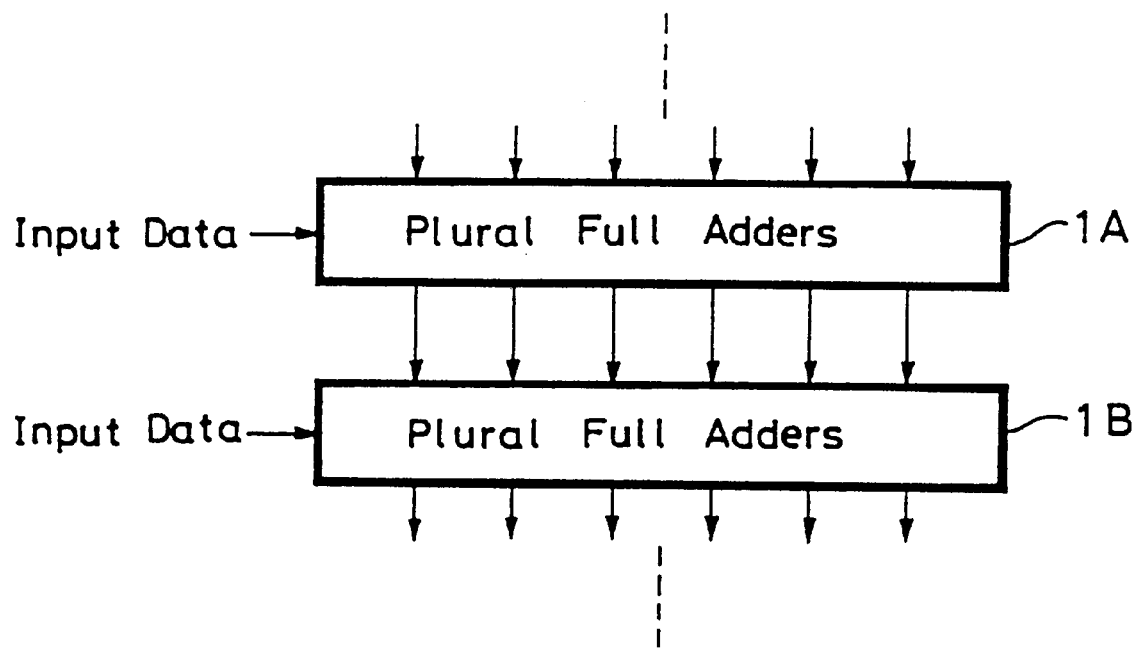
FIG. 1 is a block diagram of a conventional multiplier.
Figure 4:
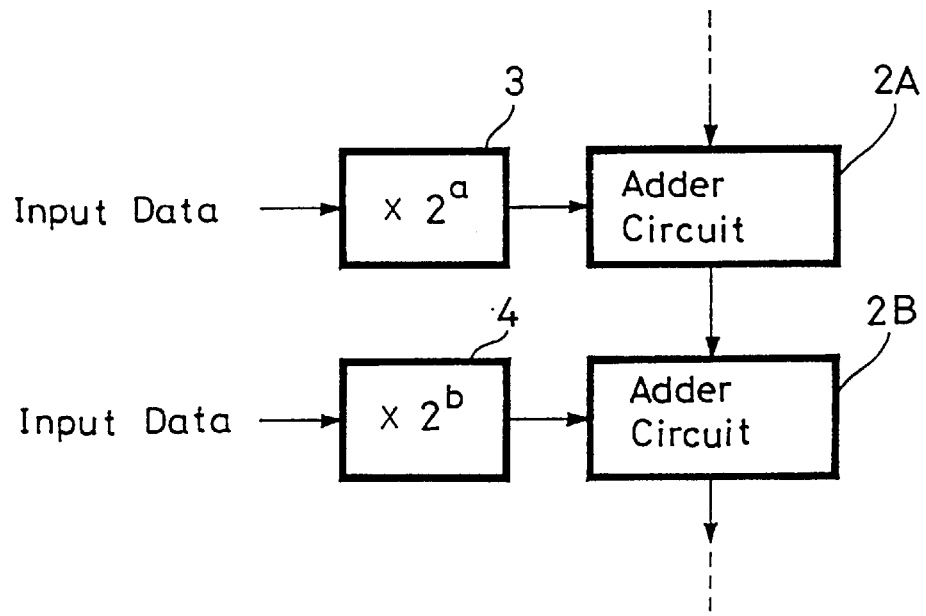
FIG. 4 is a block diagram of a multiplier to which the present invention is applied.

FIG. 4 shows a multiplier to which the present invention is applied. As shown in FIG. 1, the multiplier comprises adder circuits 2A, 2B, . . . a data processing circuit 3 for multiplying input data by $2^a$ (a is an integer), and a data processing circuit 4 for multiplying input data by $2^b$ (b is an integer). The adder circuit 2A adds data supplied thereto and data supplied through the data processing circuit 3. The sum data is supplied to the adder circuit 2B, which adds the supplied data and data supplied through the data processing circuit 4. The sum data from the adder circuit 2B is supplied to a next adder circuit (not shown). Generally, when data having a word length of n bits is supplied to an adder circuit over kn/1 signal lines, the adder circuit may be composed of n/1 k-bit adders, n/1 registers, and n/1 2-input data selectors.

Figure 5:
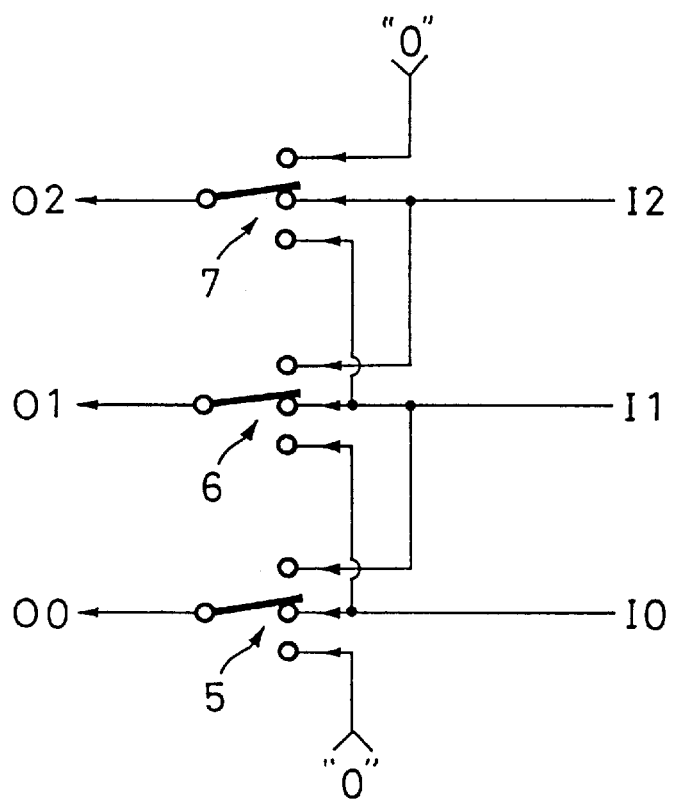
FIG. 5 is a circuit diagram of a data processing circuit according to an embodiment of the present invention, for use in the multiplier shown in FIG. 4.
Figure 6:
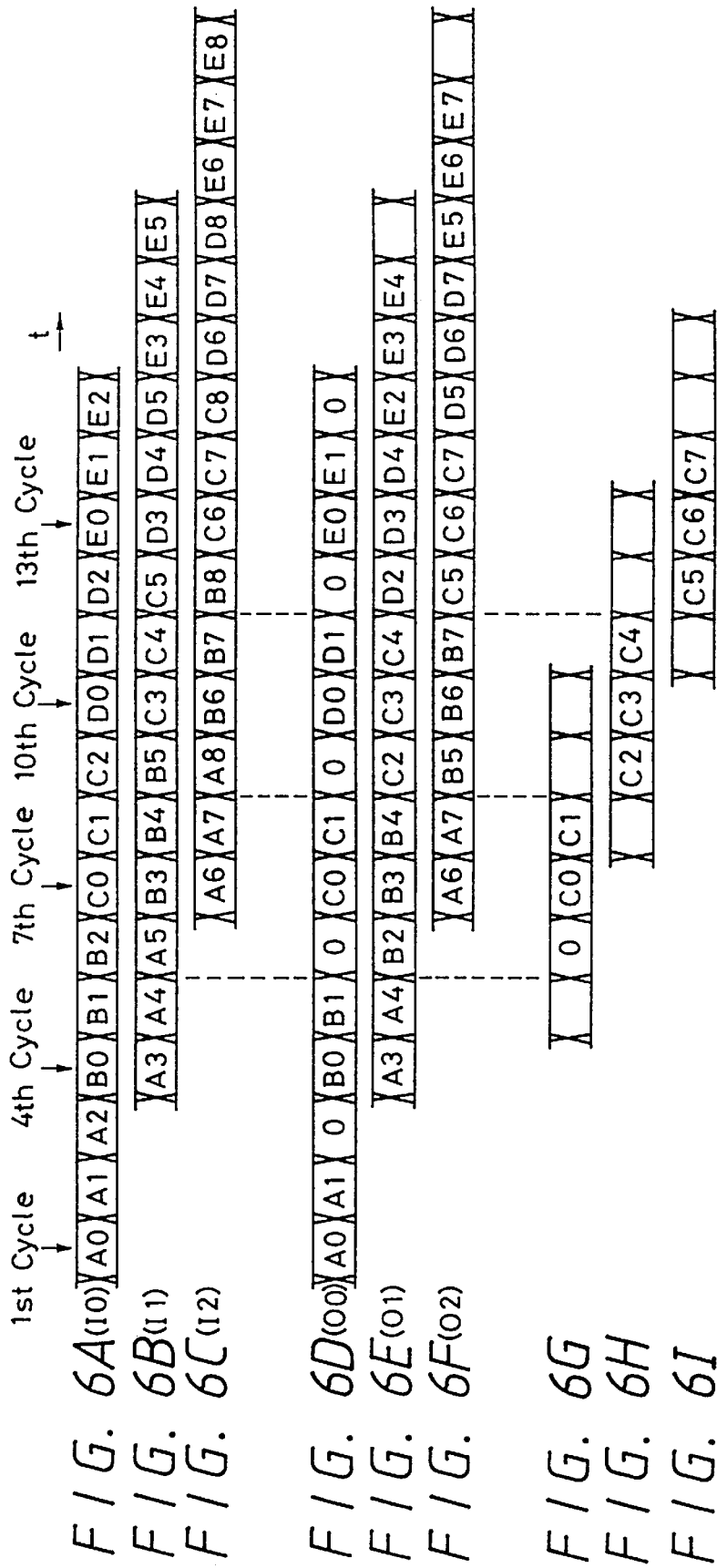
FIGS. 6A through 6I are timing charts illustrative of a mode of operation of the data processing circuit shown in FIG. 5 for multiplying input data by 2.
Figure 7:
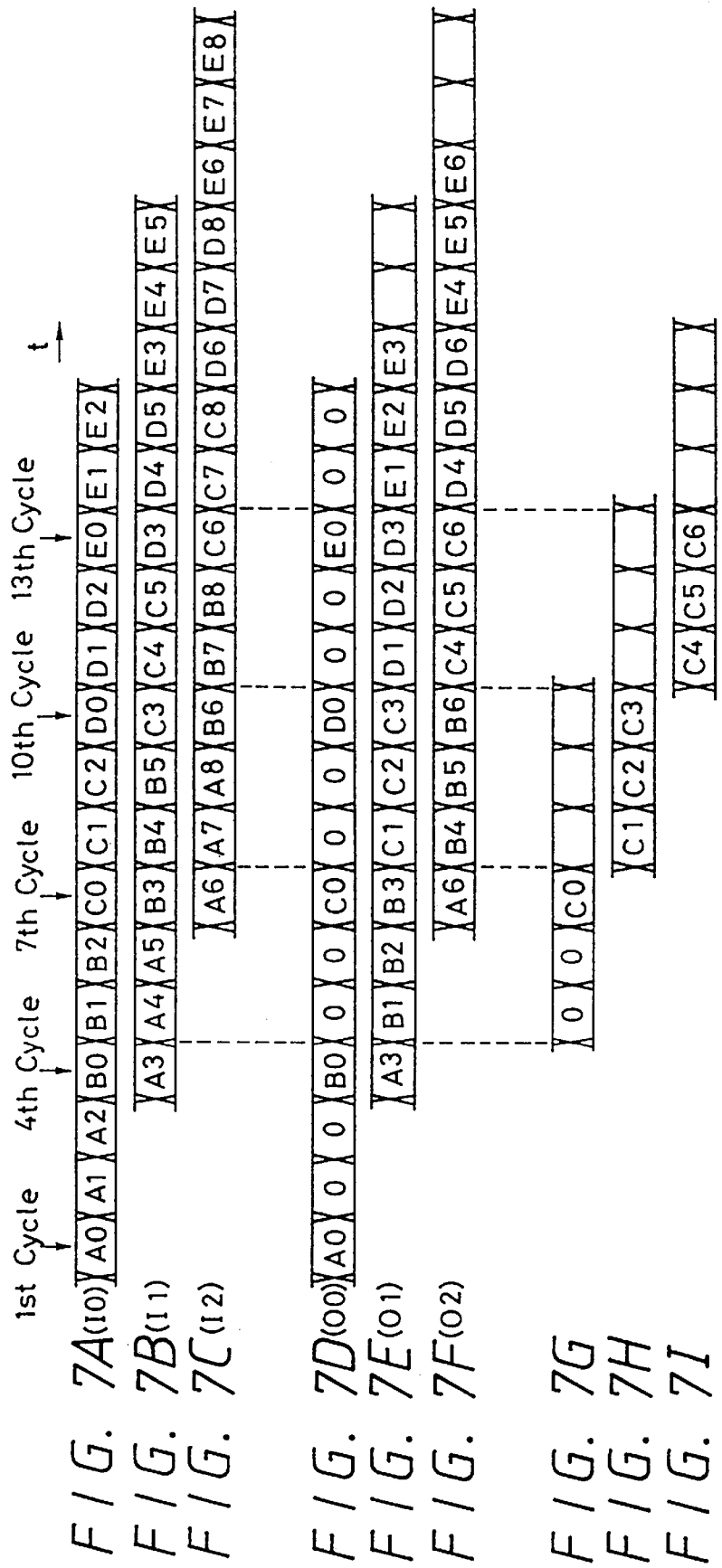
FIGS. 7A through 7I are timing charts illustrative of a mode of operation of the data processing circuit shown in FIG. 5 for multiplying input data by 4.
Figure 8:
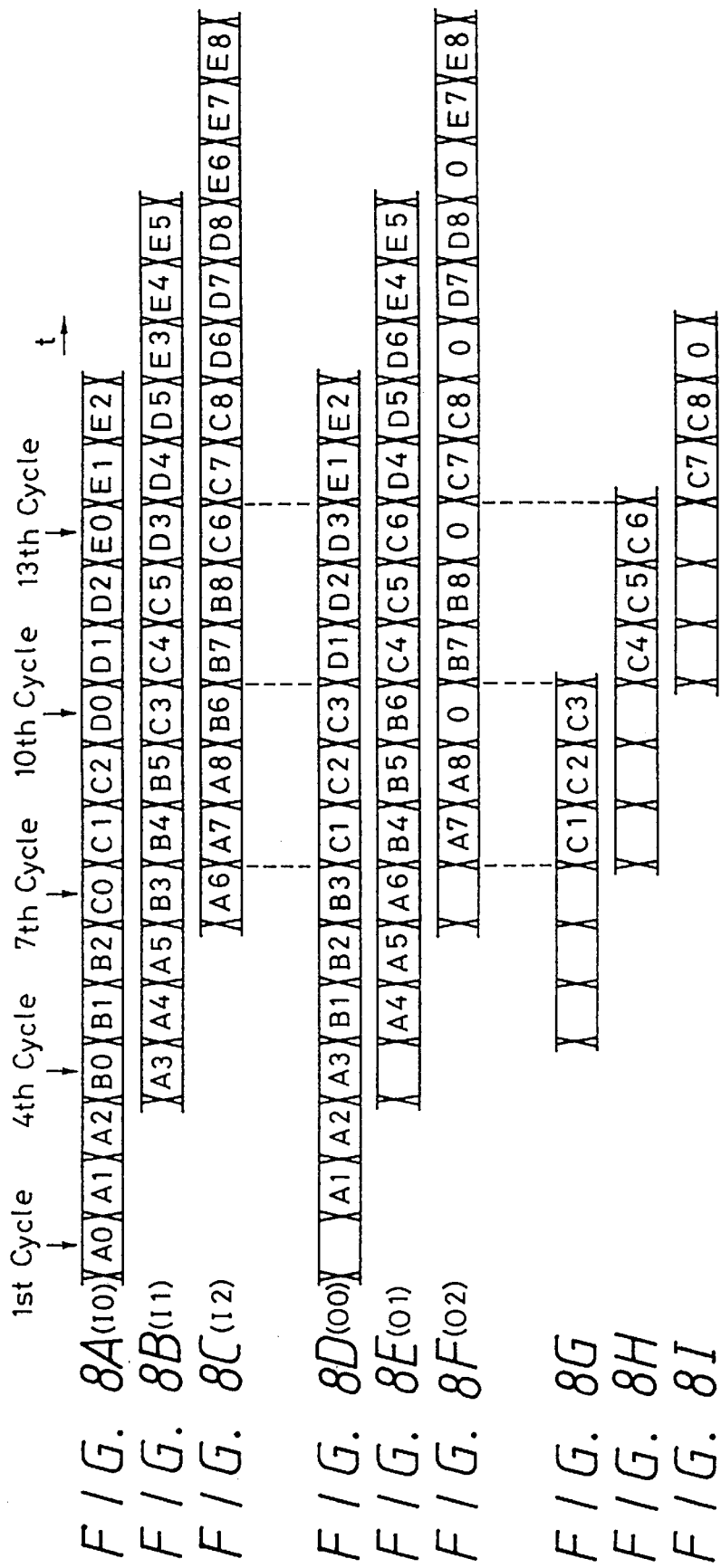
FIGS. 8A through 8I are timing charts illustrative of a mode of operation of the data processing circuit shown in FIG. 5 for multiplying input data by ½.

FIG. 5 shows, by way of example, of a circuit arrangement of the data processing circuit 3 for multiplying input data having a word length of 9 bits by $2^a$ in the multiplier shown in FIG. 4. The data processing circuit comprises first, second, and third 3-input, 1-output selectors 5, 6, 7. The first data selector 5 has a first input terminal supplied with a signal of a low level "0". The first data selector 5 has a second input terminal connected to a first input line I0, to which there is also connected a first input terminal of the second data selector 6. The first data selector 5 has a third input terminal connected to a second input line I1, to which there are also connected a second input terminal of the second data selector 6 and a first input terminal of the third data selector 7. The second data selector 6 has a third input terminal connected to a third input line I2, to which there is also connected a second input terminal of the third data selector 7. The third data selector 7 has a third input terminal supplied with a signal of a low level "0". The data selectors 5, 6, 7 have respective output terminals connected to output lines O0, O1, O2, respectively.

A mode of operation of the data processing circuit shown in FIG. 5 for multiplying input data by 2 (a=1) will be described below with reference to FIGS. 6A through 6I. Input data supplied to the data processing circuit have a word length of 9 bits, and output data transmitted from the data processing circuit also have a word length of 9 bits.

A series of data A, B, C, D, E each having a word length of 9 bits are supplied to the data processing circuit over the input lines I0, I1, I2, the data being expressed as follows:

$$A=(A8, A7, \ldots, A0),$$
$$B=(B8, B7, \ldots, B0),$$
$$C=(C8, C7, \ldots, C0),$$
$$D=(D8, D7, \ldots, D0),$$
$$E=(E8, E7, \ldots, E0) \qquad (2)$$

where A8, B8, C8, D8, E8 are MSBs and A0, B0, C0, D0, E0 are LSBs.

These data A~E are supplied in a time-division multiplexed manner in 21 cycles over the input lines I0~I2. With a=1, the output data are equal to the result of the multiplication of the input data by 2. Since the multiplication of the input data by 2 is equivalent to the shifting of the input data by 1 bit to higher bit positions, the 9-bit output data corresponding to the input data A~E are expressed below:

$$2 \times A = (A7, \ldots, A0),$$
$$2 \times B = (B7, \ldots, B0),$$
$$2 \times C = (C7, \ldots, C0),$$
$$2 \times D = (D7, \ldots, D0),$$
$$2 \times E = (E7, \ldots, E0).$$

The MSBs of the input data, which are a carry to the 10th bit, are ignored.

These output data 2A~2E are outputted in a time-division multiplexed manner in 20 cycles over the output lines O0~O2, as shown in FIGS. 6D through 6F.

Specifically, in the 3rd, 6th, 9th, 12th, 15th, . . . cycles, the data selectors 5~7 are switched over by external control signals to output the signal of "0", the signal from the input line I0, and the signal from the input line I1 respectively to the output lines O0, O1, O2. In the other cycles, the signals from the input lines I0, I1, I2 are outputted directly to the output lines O0, O1, O2, respectively.

As shown in FIGS. 6G through 6I, the data having a word length of 9 bits which are composed of the data in the 6th~8th cycles on the output line O0, the data in the 9th~11th cycles on the output line O1, and the data in the 12th~14th cycles on the output line O2 are represented by:

$$(C7, C6, \ldots, C0, 0)$$

which is equal to 2×C.

Likewise, the data 2×A, 2×B, 2×D, 2×E are produced by extracting data from certain output lines in certain nine cycles. Since the output data are outputted one cycle earlier than the input data, it is necessary to delay the output data with a register so that the output data are in accurately timed relationship to the input data.

A mode of operation of the data processing circuit shown in FIG. 5 for multiplying input data by 4 (a=2) will be described below with reference to FIGS. 7A through 7I. As shown in FIGS. 7A through 7C, data A~E each having a word length of 9 bits are supplied to the data processing circuit over the input lines I0, I1, I2. As shown in FIGS. 7D through 7F, output data produced by multiplying the input data by 4 are outputted over the output lines O0~O2.

Specifically, in the 2nd, 5th, 8th, 11th, 14th, . . . and in the 3rd, 6th, 9th, 12th, 15th, . . . cycles, the data selectors 5~7 are switched over by external control signals to output the signal of "0", the signal from the input line I0, and the signal from the input line I1 respectively to the output lines O0, O1, O2. In the other cycles, the signals from the input lines I0, I1, I2 are outputted directly to the output lines O0, O1, O2, respectively.

As shown in FIGS. 7G through 7I, the data having a word length of 9 bits which are composed of the data in the 5th~7th cycles on the output line O0, the data in the 8th—10th cycles on the output line O1, and the data in the 11th—13th cycles on the output line O2 are represented by:

$$(C6, C5, \ldots, C0, 0, 0)$$

which is equal to 4×C.

Likewise, the data 4×A, 4×B, 4×D, 4×E are produced by extracting data from certain output lines in certain nine cycles.

A mode of operation of the data processing circuit shown in FIG. 5 for multiplying input data by ½ (a=−1) will be described below with reference to FIGS. 8A through 8I. As shown in FIGS. 8A through 8C, data A~E each having a word length of 9 bits are supplied to the data processing circuit over the input lines I0, I1, I2. As shown in FIGS. 8D through 8F, output data produced by multiplying the input data by ½ are outputted over the output lines O0~O2.

Specifically, in the 4th, 7th, 10th, 13th, . . . cycles, the data selectors 5~7 are switched over by external control signals to output the signal from the input line I1, the signal from the input line I1, and the signal of "0", respectively to the output lines O0, O1, O2. In the other cycles, the signals from the input lines I0, I1, I2 are outputted directly to the output lines O0, O1, O2, respectively.

As shown in FIGS. 8G through 8I, the data having a word length of 9 bits which are composed of the data in the 8th~10th cycles on the output line O0, the data in the 11th~13th cycles on the output line O1, and the data in the 14th~16th cycles on the output line O2 are represented by:

$$(0, C8, C7, \ldots, C2, C1)$$

which is equal to (½)×C.

Likewise, the data (½)×A, (½)×B, (½)×D, (½)×E are produced by extracting data from certain output lines in certain nine cycles. Since the word length of 9 bits is multiplied by ½, the bit C0 is dropped, providing a word length of 8 bits. Then, "0" is added as an MSB to the 8-bit data, thus outputting data having a word length of 9 bits.

If the input data, which are expressed as two's complements, are to be multiplied by ½, ¼, or the like, it is necessary to copy an MSB as a sign bit to the high-order bit. For example, when the input data:

$$(A8, A7, A6, \ldots, A1, A0)$$

are multiplied by ½, the result is:

$$(A8, A8, A7, \ldots, A2, A1),$$

and when multiplied by ¼, the result is:

$$(A8, A8, A8, A7, \ldots, A2).$$

Figure 9:
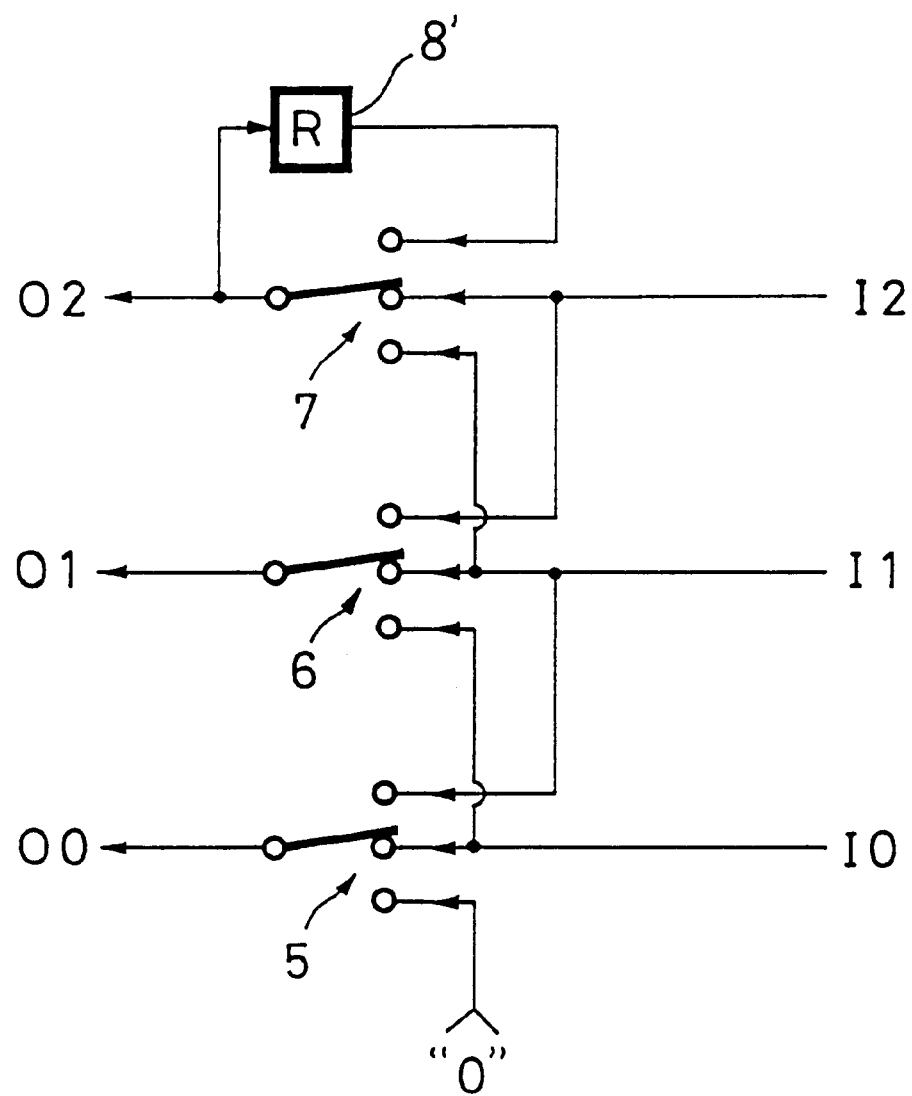
FIG. 9 is a circuit diagram of a data processing circuit according to another embodiment of the present invention.

To copy a sign bit, a circuit arrangement as shown in FIG. 9 is employed.

FIG. 9 shows a data processing circuit according to another embodiment of the present invention, for multiplying input data expressed as two's complements by $2^a$. The data processing circuit shown in FIG. 9 differs from the data processing circuit shown in FIG. 5 in that a register 8 is connected between the output terminal of the third data selector 7 and the third input terminal of the third data selector 7. The other details of the data processing circuit shown in FIG. 9 are identical to those of the data processing circuit shown in FIG. 5. The register 8 allows a sign bit to be easily copied.

Figure 10:
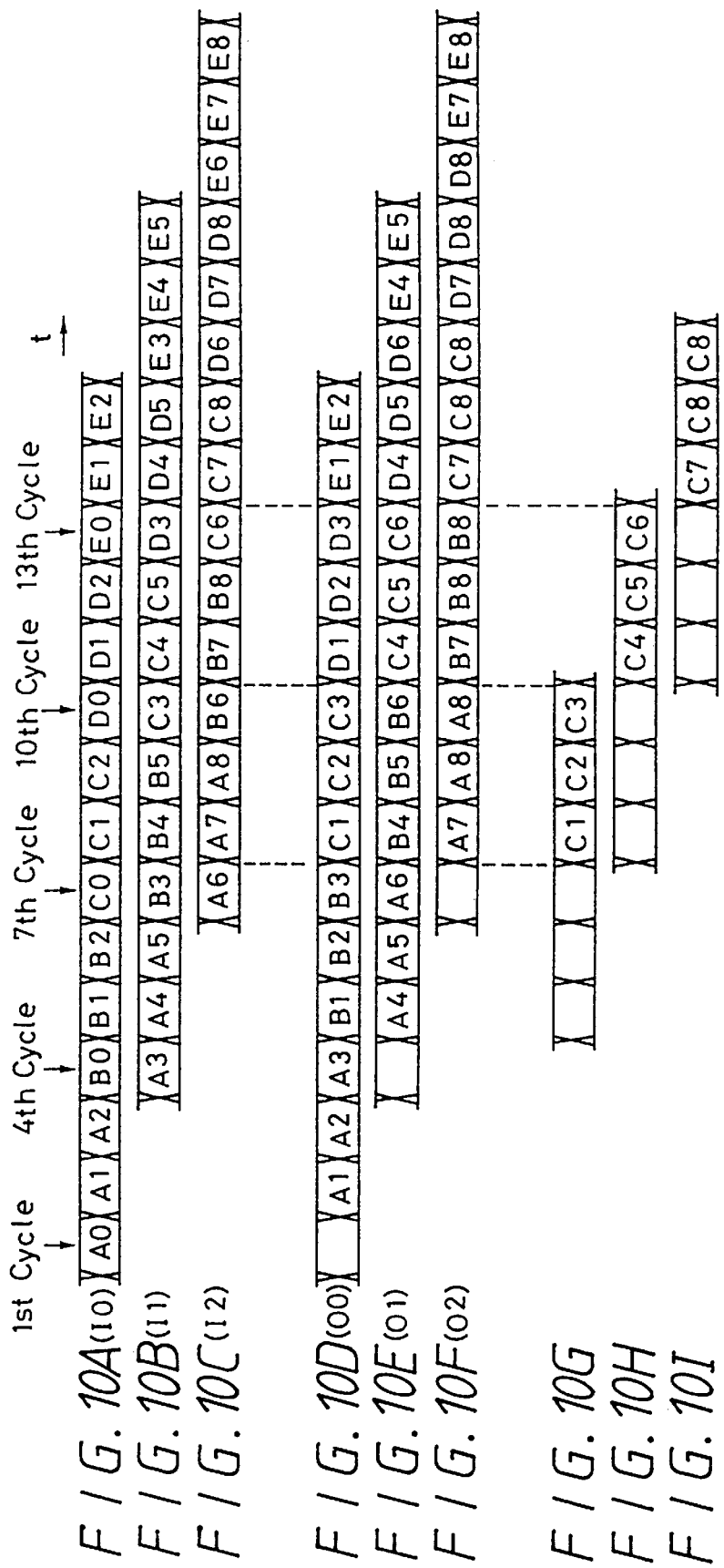
FIGS. 10A through 10I are timing charts illustrative of a mode of operation of the data processing circuit shown in FIG. 9 for multiplying input data by ½.

A mode of operation of the data processing circuit shown in FIG. 9 for multiplying input data by ½ (a=−1) will be described below with reference to FIGS. 10A through 10I. As shown in FIGS. 10A through 10C, data A~E each having a word length of 9 bits are supplied to the data processing circuit over the input lines I0, I1, I2. As shown in FIGS. 10D through 10F, output data produced by multiplying the input data by ½ are outputted over the output lines O0~O2.

Specifically, in the 4th, 7th, 10th, 13th, ..., cycles, the data selectors 5~7 are switched over by external control signals to output the signal from the input line I1, the signal from the input line I2, and the signal from the register 8, respectively to the output lines O0, O1, O2. In the other cycles, the signals from the input lines I0, I1, I2 are outputted directly to the output lines O0, O1, O2, respectively.

As shown in FIGS. 10G through 10I, the data having a word length of 9 bits which are composed of the data in the 8th ~10th cycles on the output line O0, the data in the 11th~13th cycles on the output line O1, and the data in the 14th~16th cycles on the output line O2 are represented by:

$$(C8, C8, C7, \ldots, C2, C1)$$

which is equal to the two's complement of $(\frac{1}{2}) \times C$.

Likewise, the two's complements of the data $(\frac{1}{2}) \times A$, $(\frac{1}{2}) \times B$, $(\frac{1}{2}) \times D$, $(\frac{1}{2}) \times E$ are produced by extracting data from certain output lines in certain nine cycles.

An FIR filter comprising the image data processing circuit for multiplying input data by $2^a$ as shown in FIG. 5 or 9 and adding/subtracting circuits will be described below. The FIR filter is a 3-tap FIR filter utilizing the 3rd-order Booth algorithm.

Input data are represented as a function of time t by IN(t). To determine convolutions of the input data IN(t) and three coefficients X, Y, Z, respectively, these three coefficients are expressed as two's complements of 9 bits. For example, if the coefficient X is expressed by elements (X8, X7, ..., X1, X0), the value of the coefficient X (the value is also expressed by X) can be modified as follows:

$$X = -X8 \cdot 2^8 + X7 \cdot 2^7 + X6 \cdot 2^6 + X0 \cdot 2^0 \quad (3)$$
$$= (-4X8 + 2X7 + X6 + X5) \cdot 2^6 + (-4X5 + 2X4 + X3 + X2) \cdot 2^3 +$$
$$(-4X2 + 2X1 + X0)$$
$$= x6 \cdot 2^6 + x3 \cdot 2^3 + x0$$

where
x6=−4X8+2X7+X6+X5
x3=−4X5+2X4+X3+X2
x0=−4X2+2X1+X0.

Since Xi=0 or 1 (i=0, 1, ..., 8), the value of x6, x3, x0 is either 0, ±1, ±2, ±3, or ±4. Therefore, the product of the input data IN(t) and the coefficient X is expressed by:

$$X \cdot IN(t) = x6 \cdot IN(t) \cdot 2^6 + x3 \cdot IN(t) \cdot 2^3 + x0 \cdot IN(t) \quad (4).$$

In the equation (4), the value of x6, x3, x0 is either 0, ±1, ±2, ±3, or ±4. Consequently, if $$0, IN(t), 2IN(t), 3IN(t), \text{ or } 4IN(t)$$

has already been determined, then the data corresponding to the value of x6, x3, or x0 is selected therefrom, and multiplied by $2^6$ (i.e., shifted by 6 bits), $2^3$ (i.e., shifted by 3 bits), and by 1. The results are further added and subtracted to determine the result of the equation (4). A multiplier for resolving the coefficient X into terms of 3 bits thereby to reduce the number of additions and subtractions is referred to as a multiplier utilizing the 3rd-order Booth algorithm.

The above modification of the equation (3) is also applied to the coefficients Y and Z. The final output of the filter is represented as follows:

$$\text{Output} = X \cdot IN(t) + Y \cdot IN(t+1) + Z \cdot IN(t+2) \quad (5)$$
$$= x6 \cdot IN(t) \cdot 2^6 + x3 \cdot IN(t) \cdot 2^3 + x0 \cdot IN(t) +$$
$$y6 \cdot IN(t+1) \cdot 2^6 + y3 \cdot IN(t+1) \cdot 2^3 +$$
$$y0 \cdot IN(t+1) + z6 \cdot IN(t+2) \cdot 2^6 +$$
$$z3 \cdot IN(t+2) \cdot 2^3 + z0 \cdot IN(t+2).$$

In the equation (5), the value of x6, x3, x0, y6, y3, y0, z6, z3, z0 is either 0, ±1, ±2, ±3, or ±4. Consequently, the final output can be determined when the nine data of x6·IN(t), etc. are determined in advance and are added and subtracted.

Figure 11:
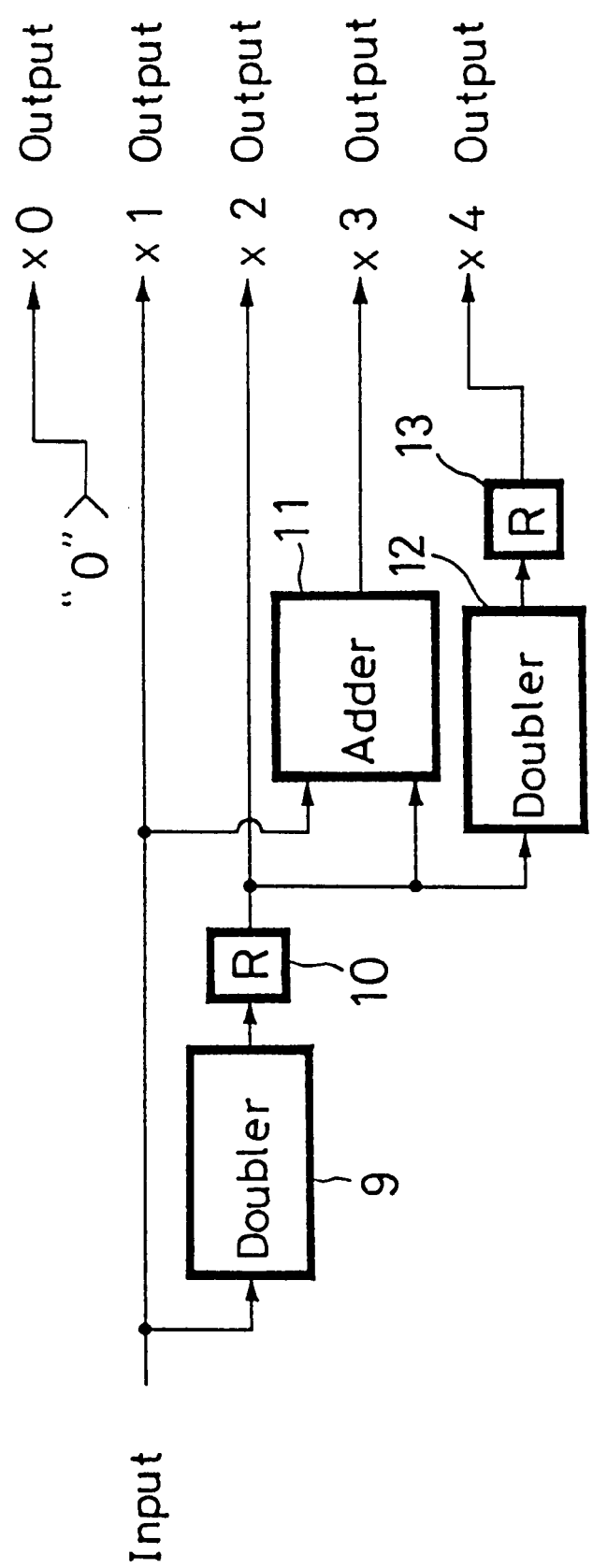
FIG. 11 is a block diagram of an integer multiplier.

An integer multiplier for use in such an FIR filter will be described below with reference to FIG. 11. As shown in FIG. 11, the integer multiplier outputs data of "0" directly as being multiplied by 0, and also outputs input data directly as being multiplied by 1. The integer multiplier includes a doubler 9 and a register 10 for producing output data which is a multiple of the input data by 2. The integer multiplier includes an adder 11 for adding the multiplied-by-1 output data and the multiplied-by-2 output data into output data which is a multiple of the input data by 3. The integer multiplier also includes a doubler 12 and a register 13 for producing output data which is a multiple of the input data by 4. The integer multiplier shown in FIG. 11 can therefore produce output data which are multiples of the input data IN(t) by 0, 1, 2, 3, and 4, respectively.

Figure 12:
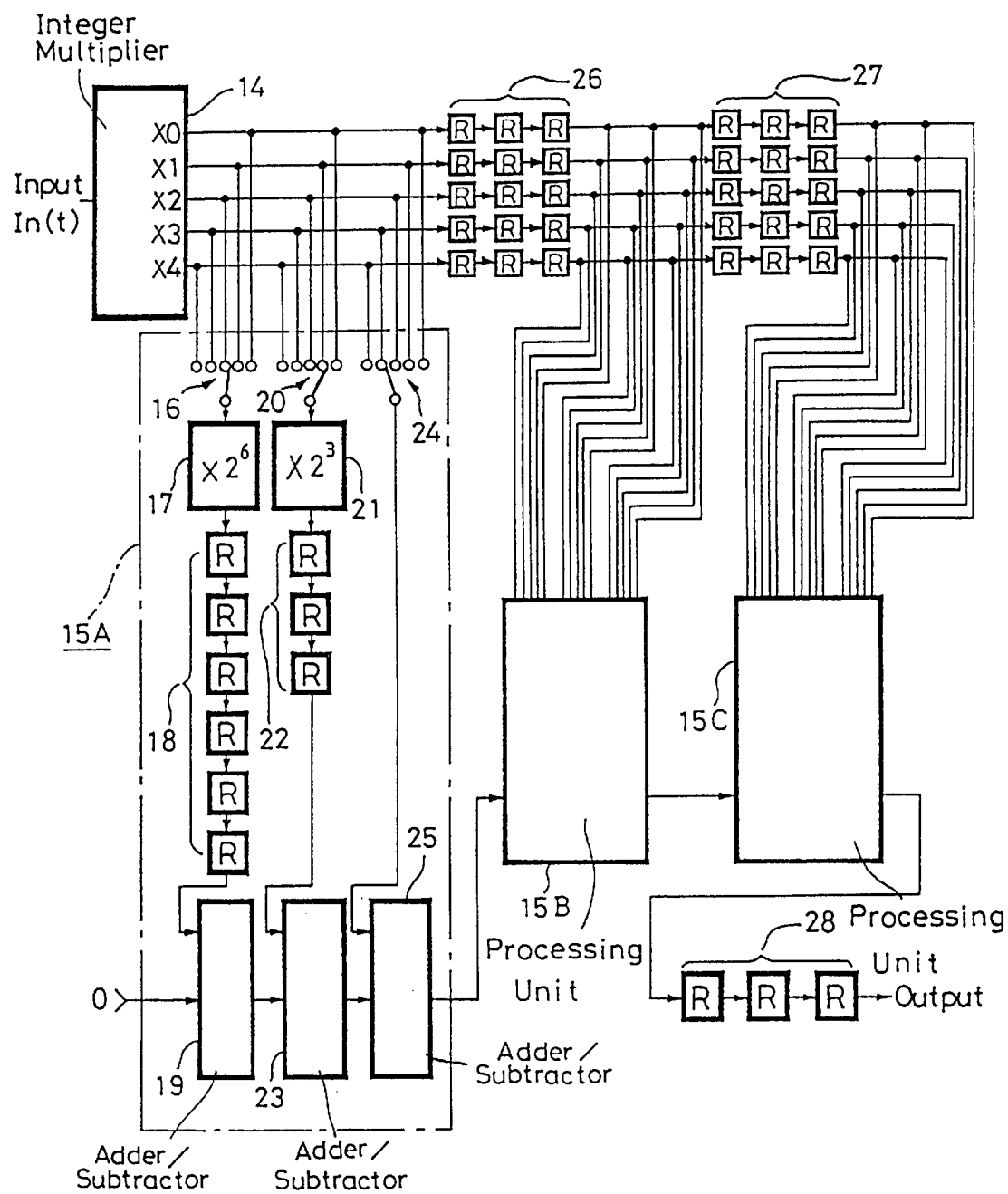
FIG. 12 is a block diagram of a 3-tap FIR filter incorporating a data processing circuit according to the present invention.
Figure 13:
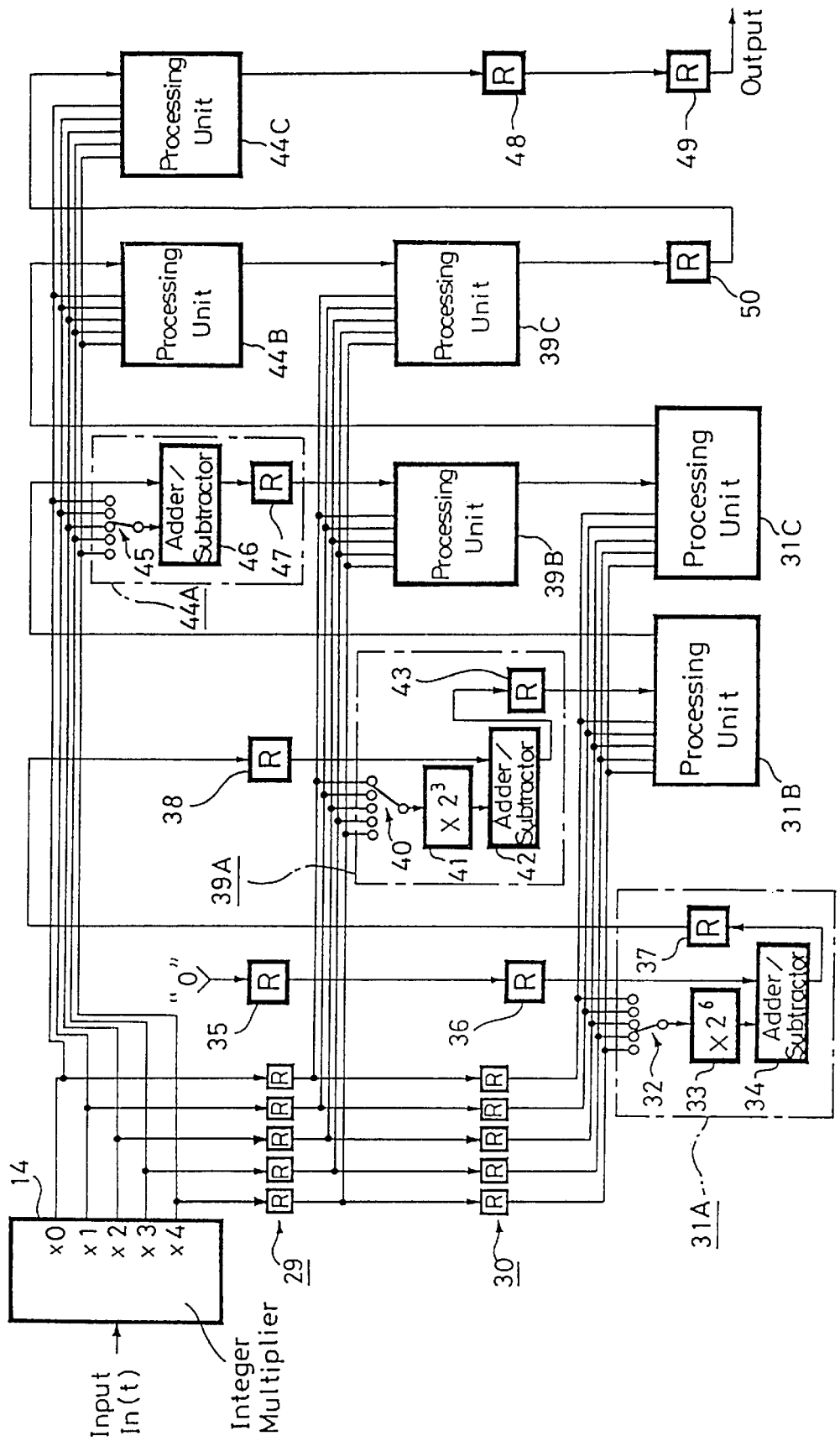
FIG. 13 is a block diagram of another 3-tap FIR filter incorporating a data processing circuit according to the present invention.

In the circuit arrangement shown in FIG. 11 and also circuit arrangements shown in FIGS. 12 and 13, a plurality of wires are indicated by a single bus line.

In the integer multiplier shown in FIG. 11, each of the doublers 9, 12 may comprise the circuit shown in FIG. 5 (in the case where a=1). In such a case, the output data are outputted one cycle earlier than the input data as described above with reference to FIGS. 6A through 6I. The registers 10, 13 connected to the respective output terminals of the doublers 9, 12 are effective to delay the output data by one cycle into timed relationship with the input data.

FIG. 12 shows a 3-tap FIR filter including an integer multiplier 14 which is of the circuit arrangement shown in FIG. 11. The integer multiplier 14 is supplied with input data IN(t), and outputs data having values of 0, IN(t), 2IN(t), 3IN(t), and 4IN(t).

The FIR filter also includes a processing unit 15A having a first 5-input data selector 16 whose input terminals are supplied with the five output data multiplied by integers from the integer multiplier 14. The processing unit 15A also includes a data processing circuit 17 for multiplying input data by $2^6$, the data processing circuit 17 being of the circuit arrangement shown in FIG. 5. The output data from the data selector 16 is supplied to one input terminal of an adder/subtractor 19 through the data processing circuit 17 and a delay circuit 18 that comprises six cascaded registers. The other input terminal of the adder/subtractor 19 is supplied with data of "0" from an external source.

The processing unit 15A also includes a second 5-input data selector 20 whose input terminals are supplied with the five output data multiplied by integers from the integer multiplier 14. The processing unit 15A further includes a data processing circuit 21 for multiplying input data by $2^3$, the data processing circuit 21 being of the circuit arrangement shown in FIG. 5. The output data from the data selector 20 is supplied to one input terminal of an adder/subtractor 23 through the data processing circuit 21 and a delay circuit 22 that comprises three cascaded registers. The other input terminal of the adder/subtractor 23 is supplied with the output data from the adder/subtractor 19. The processing unit 15A has a third 5-input data selector 24 whose input terminals are supplied with the five output data multiplied by integers from the integer multiplier 14. The output data from the data selector 24 is supplied to one input terminal of an adder/subtractor 25. The other input terminal of the adder/subtractor 25 is supplied with the output data from the adder/subtractor 23. The output data from the adder/subtractor 23 serves as the output data from the processing unit 15A.

The FIR filter shown in FIG. 12 also includes processing units 15B, 15C each identical in structure to the processing unit 15A. However, the data selectors 16, 20, 24 select different input data in these processing units 15A, 15B, 15C. The FIR filter further includes a delay circuit 26 for delaying the five output data from the integer multiplier 14 by three clock pulses, and a delay circuit 27 for delaying the five output data from the delay circuit 26 by three clock pulses. The five output data from the delay circuit 26 are supplied to the processing unit 15B, and the five output data from the delay circuit 27 are supplied to the processing circuit 15C. The output data from the initial processing unit 15A is supplied to the intermediate processing unit 15B, and the output data from the intermediate processing unit 15B is supplied to the final processing unit 15C. The output data from the final processing unit 15C is supplied to a delay circuit 28 comprising three cascaded registers. The delay circuit 28 produces output data that serves as the final output data of the FIR filter.

The data processing circuit 17 is of the circuit arrangement shown in FIG. 5 where a=6. In the case where a=6, the output data of the data processing circuit 17 are outputted six cycles earlier than the input data, and the register 18 delays the output data into timed relationship with the input data. Similarly, since the output data from the data processing circuit 20 are three cycles earlier than the input data, the register 22 delays the output data into timed relationship with the input data.

The FIR filter shown in FIG. 12 operates as follows: Depending on the values of $|z6|, |z3|, |z0|$ in the equation (5), the data selectors 16, 20, 24 in the initial processing unit 15A are controlled by external control signals to supply the adder/subtractors 19, 23, 25 with $|z6| \cdot IN(t+2) \cdot 2^6$, $|z3| \cdot IN(t+2) \cdot 2^3$, $|z0| \cdot IN(t+2)$, respectively. Furthermore, depending on the sign of z6, z3, z0, the adder/subtractors 19, 23, 25 are controlled to add or subtract the supplied data according to the following equation (6):

$$Z \cdot IN(t+2) = z6 \cdot IN(t+2) \cdot 2^6 + z3 \cdot IN(t+2) \cdot 2^3 + z0 \cdot IN(t+2) \qquad (6).$$

Figures 2A, 2B, 2C:
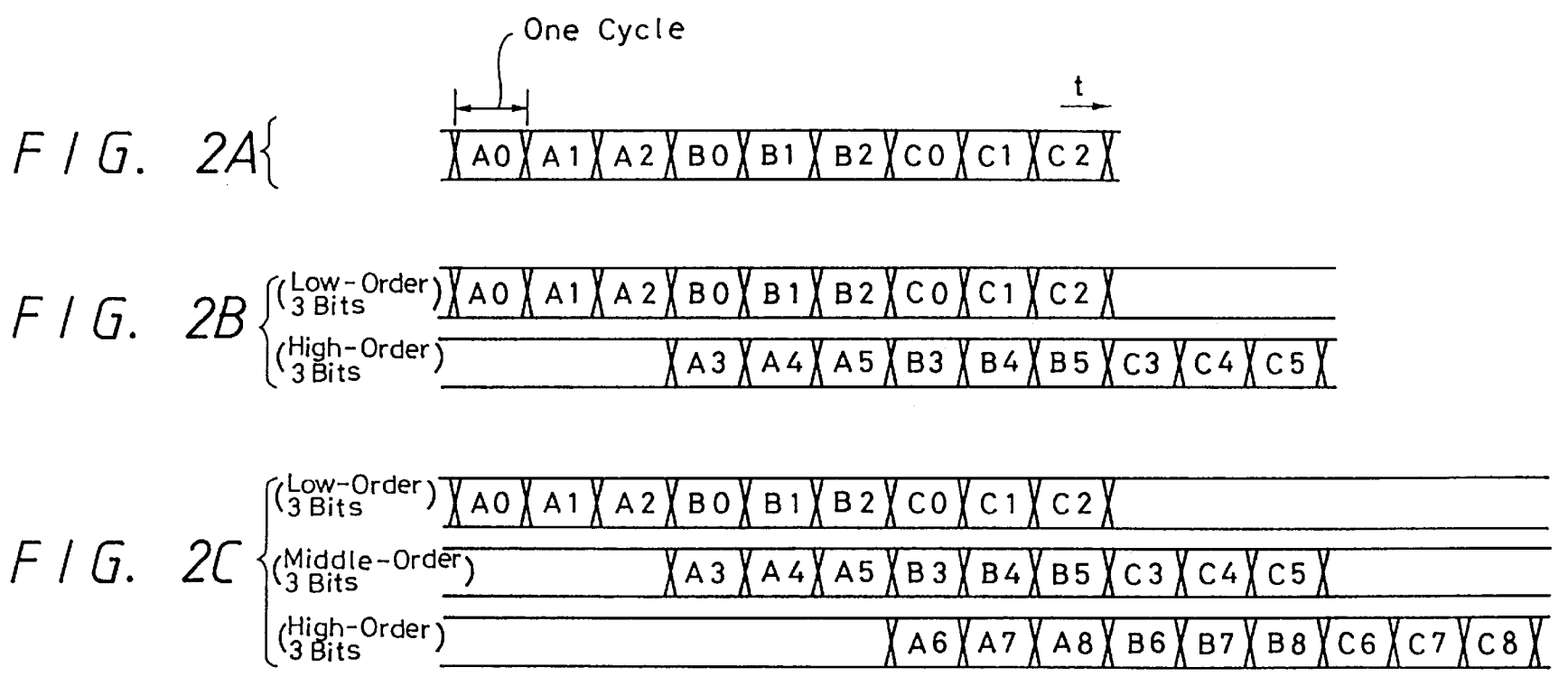

The delay circuit 26 causes a delay of three cycles in the supplied data. As can be seen from the timing charts of FIGS. 2A through 2C, the data delayed by three cycles is equal to the data that precedes it by one data item. In the intermediate processing unit 15B, depending on the value of the coefficients y6, y3, y0 in the equation (5), the three five-input data selectors and the three adder/subtractors are controlled to calculate $Y \cdot IN(t+1)$ as follows:

$$Y \cdot IN(t+1) = y6 \cdot IN(t+2) \cdot 2^6 + y3 \cdot IN(t+2) \cdot 2^3 + y0 \cdot IN(t+2) \qquad (7).$$

The calculated data $Y \cdot IN(t+1)$ is added to the data $Z \cdot IN(t+2)$ from the previous processing unit 15A.

Likewise, the final processing unit 15C calculates $X \cdot IN(t)$ according to the equation (4), and the calculated data $X \cdot IN(t)$ is added to the data $Z \cdot IN(t+2) + Y \cdot IN(T+1)$ supplied from the intermediate processing unit 15B. Therefore, the output data represented by the equation (5) is finally produced. The circuit arrangement shown in FIG. 12 has a total of nine adder/subtractors connected in series. Therefore, if it is assumed that the processing time of one adder/subtractor is represented by T, the total processing time is indicated by 9T.

FIG. 13 shows another 3-tap FIR filter which is equivalent to, but faster than, the FIR filter shown in FIG. 12.

In the circuit arrangement shown in FIG. 13, five output data from the integer multiplier 14 are supplied through registers 29, 30 to a processing unit 31A. In the processing unit 31A, the five output data from the register 30 are supplied to a 5-input data selector 32, which supplies its output data through a data processing circuit 33 for multiplying input data by $2^6$ to an input terminal of an adder/subtractor 34. The other input terminal of the adder/subtractor 34 is supplied with data of "0" through two registers 35, 36 from an external source. The output data from the adder/subtractor 34 is supplied to a register 37 whose output data serves as the output data of the processing unit 31A. The output terminals of the register 30 are connected to two processing units 31B, 31C parallel to the processing unit 31A, the processing units 31B, 31C being identical in structure to the processing unit 31A.

The five output data from the register 29 are supplied to a processing unit 39A. In the processing unit 39A, the five output data from the register 29 are supplied to a 5-input data selector 40, which supplies its output data through a data processing circuit 41 for multiplying input data by $2^3$ to an input terminal of an adder/subtractor 42. The other input terminal of the adder/subtractor 42 is supplied with the output data from the processing unit 31A through a register 38. The output data from the adder/subtractor 42 is supplied to a register 43 whose output data serves as the output data of the processing unit 39A. The output data from the processing unit 39A is supplied to the processing unit 31B. The output terminals of the register 29 are connected to two processing units 39B, 39C parallel to the processing unit 39A, the processing units 39B, 39C being identical in structure to the processing unit 39A.

The five output data from the integer multiplier 14 are supplied to a processing unit 44A. In the processing unit 44A, the five output data from the integer multiplier 14 are supplied to a 5-input data selector 45, which supplies its output data to an input terminal of an adder/subtractor 46. The other input terminal of the adder/subtractor 46 is supplied with the output data from the processing unit 31B. The output data from the adder/subtractor 46 is supplied to a register 47 whose output data serves as the output data of the processing unit 44A. The output data from the processing unit 44A is supplied to the processing unit 39B. The output terminals of the integer multiplier 14 are connected to two processing units 44B, 44C parallel to the processing unit 44A, the processing units 44B, 44C being identical in structure to the processing unit 44A.

The output data from the processing unit 39B is supplied to the processing unit 31C, whose output data is supplied to the processing unit 44B. The output data from the processing unit 44B is supplied to the processing unit 39C, whose output data is supplied through a register 50 to the processing unit 44C. The output data from the processing unit 44C is supplied through two registers 48, 49 as final output data of the FIR filter. The processing time required by the circuit arrangement shown in FIG. 13 is equal to the processing time of a single adder/subtractor. Therefore, the FIR filter shown in FIG. 13 has a higher processing speed than the FIR filter shown in FIG. 12.

Figures 3A, 3B, 3C:
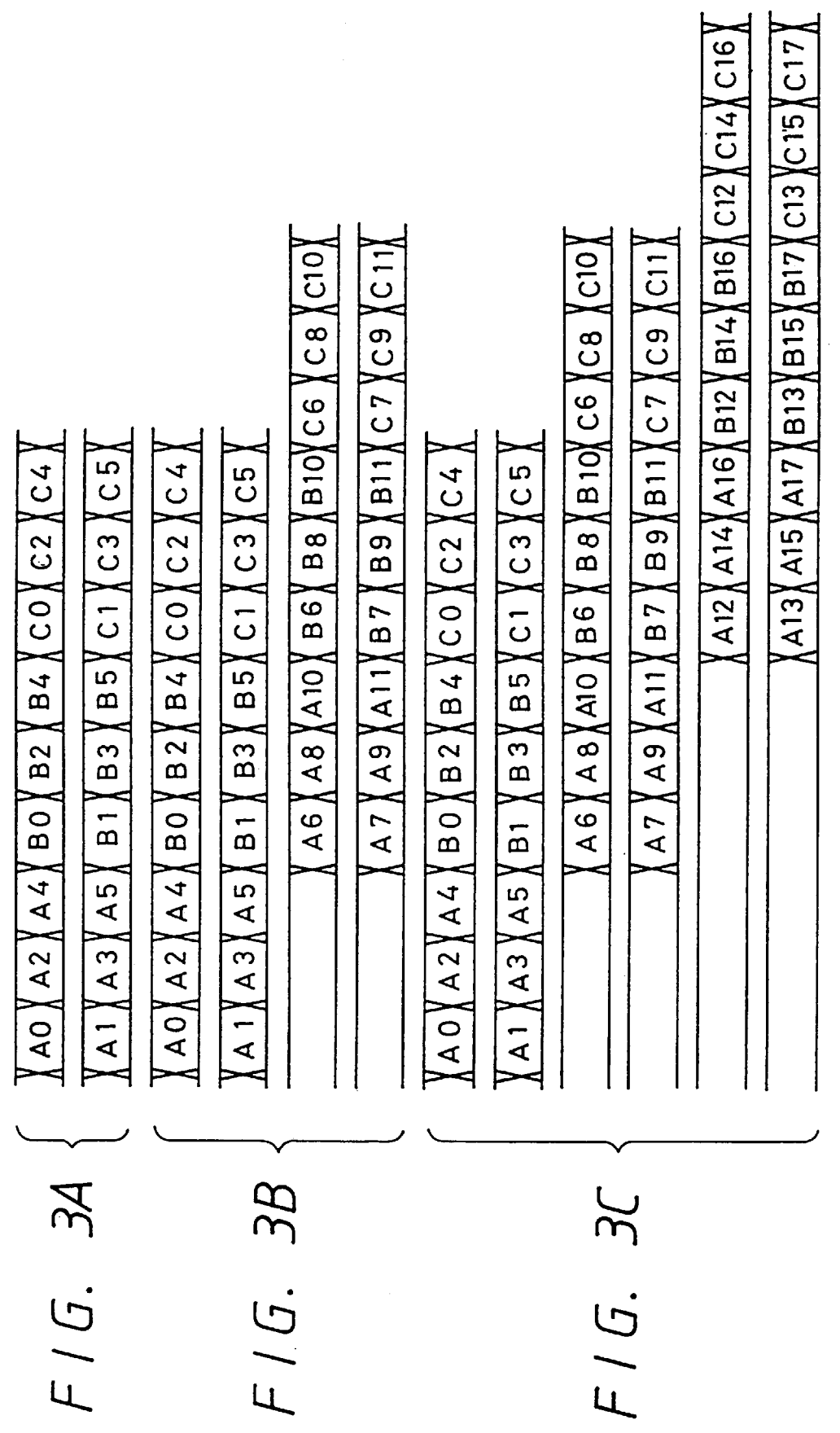

The present invention is not limited to the illustrated embodiment, but may be applied to a system where input data are transmitted as shown in FIGS. 3A through 3C.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. An FIR filter, comprising:
   an integer multiplier for receiving input data and for outputting a plurality of different multiples of said input data;
   a plurality of first processing unit for receiving said multiples of said input data and for outputting a processed signal;
   a plurality of second processing unit for receiving said multiples of said input data and a processed signal from another processing unit, and for outputting a processed signal; and
   a plurality of third processing unit for receiving said multiples of said input data and a processed signal from another processing unit, and for outputting a processed signal,
   wherein each of said first processing units including
   an input selector for selecting from among said multiples of input data;
   a multiplier which multiplies said selected multiple by a factor of $2^6$; and an adder/subtracter.

2. An FIR filter as claimed in claim 1, wherein each of said second processing units comprise:
   an input selector for selecting from among said multiples of input data;
   a multiplier which multiplies said selected multiple by a factor of $2^3$; and
   an adder/subtracter.

3. An FIR filter as claimed in claim 2, wherein each of said second processing units:
   provide said selected multiple of input data from said input selector to said multiplier;
   provide an output of said multiplier to said adder/subtracter; and
   provide a processed signal from another processing unit to said adder/subtracter.

4. An FIR filter as claimed in claim 1, wherein each of said third processing units comprise:
   an input selector for selecting from among said multiples of input data; and
   an adder/subtracter.

5. An FIR filter as claimed in claim 4, wherein each of said third processing units:
   provide said selected multiple of input data from said input selector to said adder/subtracter; and
   provide a processed signal from another processing unit to said adder/subtracter.

6. An FIR filter as claimed in claim 1, wherein said multiples of input data are supplied to said plurality of second processing units after being delayed by a first amount.

7. An FIR filter as claimed in claim 6, wherein said multiples of input data are supplied to said plurality of first processing units after being delayed by a second amount greater than said first amount.

8. An FIR filter as claimed in claim 1, wherein the number of said first processing units is three, the number of said second processing units is three and the number of said third processing units is three.

9. An FIR filter as claimed in claim 8, wherein a first of said first processing units process a low-level signal and one of said multiples to produce a processed signal.

10. An FIR filter as claimed in claim 9, wherein:
    said processed signal from the first of said first processing units is supplied to a first of said second processing units which outputs a further processed signal;
    said processed signal from the first of said second processing units is supplied to a second of said first processing units which outputs a further processed signal;
    said processed signal from the second of said first processing units is supplied to a first of said third processing units which outputs a further processed signal;
    said processed signal from the first of said third processing units is supplied to a second of said second processing units which outputs a further processed signal;
    said processed signal from the second of said second processing units is supplied to a third of said first processing units which outputs a further processed signal;
    said processed signal from the third of said first processing units is supplied to a second of said third processing units which outputs a further processed signal;
    said processed signal from the second of said third processing units is supplied to a third of said second processing units which outputs a further processed signal; and
    said processed signal from the third of said second processing units is supplied to a third of said third processing units which outputs a further processed output signal.

11. An FIR filter, comprising:
    an integer multiplier for receiving input data and for outputting a plurality of different multiples of said input data;
    a plurality of first processing unit for receiving said multiples of said input data and for outputting a processed signal;
    a plurality of second processing unit for receiving said multiples of said input data and a processed signal from another processing unit, and for outputting a processed signal; and
    a plurality of third processing unit for receiving said multiples of said input data and a processed signal from another processing unit, and for outputting a processed signal wherein,
    each of said second processing units include:
    an input selector for selecting from among said multiples of input data;
    a multiplier which multiplies said selected multiple by a factor of $2^3$; and
    an adder/subtracter.

12. An FIR filter as claimed in claim 11, wherein each of said second processing units:
    provide said selected multiple of input data from said input selector to said multiplier;
    provide an output of said multiplier to said adder/subtracter; and
    provide a processed signal from another processing unit to said adder/subtracter.

13. An FIR filter as claimed in claim 11, wherein each of said third processing units comprise:

an input selector for selecting from among said multiples of input data; and an adder/subtracter.

14. An FIR filter as claimed in claim 13, wherein each of said third processing units:

provide said selected multiple of input data from said input selector to said adder/subtracter; and provide a processed signal from another processing unit to said adder/subtracter.

15. An FIR filter as claimed in claim 11, wherein said multiples of input data are supplied to said plurality of second processing units after being delayed by a first amount.

16. An FIR filter as claimed in claim 15, wherein said multiples of input data are supplied to said plurality of first processing units after being delayed by a second amount greater than said first amount.

17. An FIR filter as claimed in claim 11, wherein the number of said first processing units is three, the number of said second processing units is three and the number of said third processing units is three.

18. An FIR filter as claimed in claim 17, wherein a first of said first processing units process a low-level signal and one of said multiples to produce a processed signal.

19. An FIR filter as claimed in claim 18, wherein:

said processed signal from the first of said first processing units is supplied to a first of said second processing units which outputs a further processed signal;

said processed signal from the first of said second processing units is supplied to a second of said first processing units which outputs a further processed signal;

said processed signal from the second of said first processing units is supplied to a first of said third processing units which outputs a further processed signal;

said processed signal from the first of said third processing units is supplied to a second of said second processing units which outputs a further processed signal;

said processed signal from the second of said second processing units is supplied to a third of said first processing units which outputs a further processed signal;

said processed signal from the third of said first processing units is supplied to a second of said third processing units which outputs a further processed signal;

said processed signal from the second of said third processing units is supplied to a third of said second processing units which outputs a further processed signal; and said processed signal from the third of said second processing units is supplied to a third of said third processing units which outputs a further processed output signal.

20. An FIR filter, comprising:

an integer multiplier for receiving input data and for outputting a plurality of different multiples of said input data;

a plurality of first processing unit for receiving said multiples of said input data and for outputting a processed signal;

a plurality of second processing unit for receiving said multiples of said input data and a processed signal from another processing unit, and for outputting a processed signal; and a plurality of third processing unit for receiving said multiples of said input data and a processed signal from another processing unit, and for outputting a processed signal wherein, each of said third processing units comprise:

an input selector for selecting from among said multiples of input data; and an adder/subtracter.

21. An FIR filter as claimed in claim 20, wherein each of said first processing units comprise:

an input selector for selecting from among said multiples of input data;

a multiplier which multiplies said selected multiple by a factor of $2^6$; and an adder/subtracter.

22. An FIR filter as claimed in claim 20, wherein each of said second processing units comprise:

an input selector for selecting from among said multiples of input data;

a multiplier which multiplies said selected multiple by a factor of $2^3$; and an adder/subtracter.

23. An FIR filter as claimed in claim 22, wherein each of said second processing units:

provide said selected multiple of input data from said input selector to said multiplier;

provide an output of said multiplier to said adder/subtracter; and provide a processed signal from another processing unit to said adder/subtracter.

24. An FIR filter as claimed in claim 20, wherein each of said third processing units:

provide said selected multiple of input data from said input selector to said adder/subtracter; and provide a processed signal from another processing unit to said adder/subtracter.

25. An FIR filter as claimed in claim 20, wherein said multiples of input data are supplied to said plurality of second processing units after being delayed by a first amount.

26. An FIR filter as claimed in claim 25, wherein said multiples of input data are supplied to said plurality of first processing units after being delayed by a second amount greater than said first amount.

27. An FIR filter as claimed in claim 20, wherein the number of said first processing units is three, the number of said second processing units is three and the number of said third processing units is three.

28. An FIR filter as claimed in claim 27, wherein a first of said first processing units process a low-level signal and one of said multiples to produce a processed signal.

29. An FIR filter as claimed in claim 28, wherein:

said processed signal from the first of said first processing units is supplied to a first of said second processing units which outputs a further processed signal;

said processed signal from the first of said second processing units is supplied to a second of said first processing units which outputs a further processed signal;

said processed signal from the second of said first processing units is supplied to a first of said third processing units which outputs a further processed signal;

said processed signal from the first of said third processing units is supplied to a second of said second processing units which outputs a further processed signal;

said processed signal from the second of said second processing units is supplied to a third of said first processing units which outputs a further processed signal;

said processed signal from the third of said first processing units is supplied to a second of said third processing units which outputs a further processed signal;

said processed signal from the second of said third processing units is supplied to a third of said second processing units which outputs a further processed signal; and said processed signal from the third of said second processing units is supplied to a third of said third processing units which outputs a further processed output signal.

30. An FIR filter, comprising:

an integer multiplier for receiving input data and for outputting a plurality of different multiples of said input data;

a plurality of first processing unit for receiving said multiples of said input data and for outputting a processed signal;

a plurality of second processing unit for receiving said multiples of said input data and a processed signal from another processing unit, and for outputting a processed signal; and a plurality of third processing unit for receiving said multiples of said input data and a processed signal from another processing unit, and for outputting a processed signal wherein, said multiples of input data are supplied to said plurality of second processing units after being delayed by a first amount.

31. An FIR filter as claimed in claim 30, wherein each of said first processing units includes:

an input selector for selecting from among said multiples of input data;

a multiplier which multiplies said selected multiple by a factor of $2^6$; and an adder/subtracter.

32. An FIR filter as claimed in claim 30, wherein each of said second processing units comprise:

an input selector for selecting from among said multiples of input data;

a multiplier which multiplies said selected multiple by a factor of $2^3$; and an adder/subtracter.

33. An FIR filter as claimed in claim 32, wherein each of said second processing units:

provide said selected multiple of input data from said input selector to said multiplier;

provide an output of said multiplier to said adder/subtracter; and provide a processed signal from another processing unit to said adder/subtracter.

34. An FIR filter as claimed in claim 30, wherein each of said third processing units comprise:

an input selector for selecting from among said multiples of input data; and an adder/subtracter.

35. An FIR filter as claimed in claim 34, wherein each of said third processing units:

provide said selected multiple of input data from said input selector to said adder/subtracter; and provide a processed signal from another processing unit to said adder/subtracter.

36. An FIR filter as claimed in claim 30, wherein said multiples of input data are supplied to said plurality of first processing units after being delayed by a second amount greater than said first amount.

37. An FIR filter as claimed in claim 30, wherein the number of said first processing units is three, the number of said second processing units is three and the number of said third processing units is three.

38. An FIR filter as claimed in claim 37, wherein a first of said first processing units process a low-level signal and one of said multiples to produce a processed signal.

39. An FIR filter as claimed in claim 38, wherein:

said processed signal from the first of said first processing units is supplied to a first of said second processing un its which outputs a further processed signal;

said processed signal from the first of said second processing units is supplied to a second of said first processing units which outputs a further processed signal;

said processed signal from the second of said first processing units is supplied to a first of said third processing units which outputs a further processed signal;

said processed signal from the first of said third processing units is supplied to a second of said second processing units which outputs a further processed signal;

said processed signal from the second of said second processing units is supplied to a third of said first processing units which outputs a further processed signal;

said processed signal from the third of said first processing units is supplied to a second of said third processing units which outputs a further processed signal;

said processed signal from the second of said third processing units is supplied to a third of said second processing units which outputs a further processed signal; and said processed signal from the third of said second processing units is supplied to a third of said third processing units which outputs a further processed output signal.

40. An FIR filter, comprising:

an integer multiplier for receiving input data and for outputting a plurality of different multiples of said input data;

a plurality of first processing unit for receiving said multiples of said input data and for outputting a processed signal;

a plurality of second processing unit for receiving said multiples of said input data and a processed signal from another processing unit, and for outputting a processed signal; and a plurality of third processing unit for receiving said multiples of said input data and a processed signal from another processing unit, and for outputting a processed signal wherein, the number of said first processing units is three, the number of said second processing units is three and the number of said third processing units is three.

41. An FIR filter as claimed in claim 40, wherein each of said first processing units comprise:

an input selector for selecting from among said multiples of input data;

a multiplier which multiplies said selected multiple by a factor of $2^6$; and an adder/subtracter.

42. An FIR filter as claimed in claim 40, wherein each of said second processing units comprise:

an input selector for selecting from among said multiples of input data;

a multiplier which multiplies said selected multiple by a factor of $2^3$; and an adder/subtracter.

43. An FIR filter as claimed in claim 42, wherein each of said second processing units:

provide said selected multiple of input data from said input selector to said multiplier;

provide an output of said multiplier to said adder/subtracter; and provide a processed signal from another processing unit to said adder/subtracter.

44. An FIR filter as claimed in claim 40, wherein each of said third processing units comprise:

an input selector for selecting from among said multiples of input data; and an adder/subtracter.

45. An FIR filter as claimed in claim 44, wherein each of said third processing units:

provide said selected multiple of input data from said input selector to said adder/subtracter; and provide a processed signal from another processing unit to said adder/subtracter.

46. An FIR filter as claimed in claim 40, wherein said multiples of input data are supplied to said plurality of second processing units after being delayed by a first amount.

47. An FIR filter as claimed in claim 46, wherein said multiples of input data are supplied to said plurality of first processing units after being delayed by a second amount greater than said first amount.

48. An FIR filter as claimed in claim 40, wherein a first of said first processing units process a low-level signal and one of said multiples to produce a processed signal.

49. An FIR filter as claimed in claim 48, wherein:

said processed signal from the first of said first processing units is supplied to a first of said second processing units which outputs a further processed signal;

said processed signal from the first of said second processing units is supplied to a second of said first processing units which outputs a further processed signal;

said processed signal from the second of said first processing units is supplied to a first of said third processing units which outputs a further processed signal;

said processed signal from the first of said third processing units is supplied to a second of said second processing units which outputs a further processed signal;

said processed signal from the second of said second processing units is supplied to a third of said first processing units which outputs a further processed signal;

said processed signal from the third of said first processing units is supplied to a second of said third processing units which outputs a further processed signal;

said processed signal from the second of said third processing units is supplied to a third of said second processing units which outputs a further processed signal; and said processed signal from the third of said second processing units is supplied to a third of said third processing units which outputs a further processed output signal.

* * * * *